United States Patent [19]
Kametani

[11] Patent Number: 5,335,336
[45] Date of Patent: Aug. 2, 1994

[54] MEMORY DEVICE HAVING REFRESH MODE RETURNING PREVIOUS PAGE ADDRESS FOR RESUMED PAGE MODE

[75] Inventor: Masatsugu Kametani, Ibaraki, Japan

[73] Assignee: Hitachi, Ltd., Tokyo, Japan

[21] Appl. No.: 79,852

[22] Filed: Jun. 22, 1993

Related U.S. Application Data

[63] Continuation of Ser. No. 329,306, Mar. 27, 1989, abandoned.

[30] Foreign Application Priority Data

Mar. 28, 1988 [JP] Japan .................. 63-74145

[51] Int. Cl.$^5$ .................. G06F 12/00; G11C 7/00; G11C 8/00
[52] U.S. Cl. .................. 395/425; 365/222; 365/238.5
[58] Field of Search .......... 365/238.5, 230.02, 230.04, 365/230.03, 222, 193; 395/425, 400

[56] References Cited

U.S. PATENT DOCUMENTS

| | | | |
|---|---|---|---|
| 3,618,041 | 11/1971 | Horikoshi | 395/425 |
| 3,736,574 | 5/1973 | Gersbach | 364/200 |
| 4,286,321 | 8/1981 | Baker et al. | 364/200 |
| 4,334,295 | 6/1982 | Nagami | 365/222 |
| 4,393,472 | 7/1983 | Shimada et al. | 365/230.04 |
| 4,608,666 | 8/1986 | Uchida | 365/222 |
| 4,631,701 | 12/1986 | Kappeler et al. | 365/222 |
| 4,691,279 | 9/1987 | Danilenko et al. | 364/200 |
| 4,727,510 | 2/1988 | Scheuneman et al. | 395/400 |
| 4,796,232 | 1/1989 | House | 365/222 X |
| 4,797,850 | 1/1989 | Amitai | 395/425 |
| 4,800,531 | 1/1989 | Dehganpour et al. | 365/222 |
| 4,823,324 | 4/1989 | Taylor et al. | 365/230.03 |
| 4,847,758 | 7/1989 | Olson et al. | 364/200 |
| 4,849,937 | 7/1989 | Yoshimoto | 365/230.04 |
| 4,870,622 | 9/1989 | Aria et al. | 365/230.03 |
| 4,907,199 | 3/1990 | Dosaka et al. | 365/222 X |
| 4,914,575 | 4/1990 | Kihara et al. | 364/200 |
| 4,933,835 | 6/1990 | Sachs et al. | 364/200 |
| 4,933,910 | 6/1990 | Olson et al. | 365/230.02 |
| 4,937,791 | 6/1990 | Steele et al. | 365/230.03 |
| 5,159,676 | 10/1992 | Wicklund et al. | 395/425 |

FOREIGN PATENT DOCUMENTS 197842 9/1987 Japan .

Primary Examiner—Joseph L. Dixon
Assistant Examiner—Michael A. Whitfield
Attorney, Agent, or Firm—Antonelli, Terry, Stout & Kraus

[57] ABSTRACT

A memory device comprises a dynamic random access memory (DRAM) organized by page and a memory access devices. The DRAM corresponding to the pages is divided into a plurality of groups each constituted of pages for storing data which are unlikely to give rise to interference between pages. The DRAM of each group is constituted as a memory system which responds to page access. The memory access devices are provided separately for the memory system of each group. Each memory access device has a memory means which, in response to an access designating a page address of the memory system associated therewith, stores an old page address designated at least one access earlier, and judging means which, in response to said page address access, judges whether or not the new page address designated by said access coincides with said old page address stored in said storage means. Page access is conducted in accordance with the old address if the judging means judges that the old and new page addresses coincide and is conducted in accordance with the new address after changing the page to be accessed to said new page if the old and new page addresses do not coincide.

22 Claims, 9 Drawing Sheets

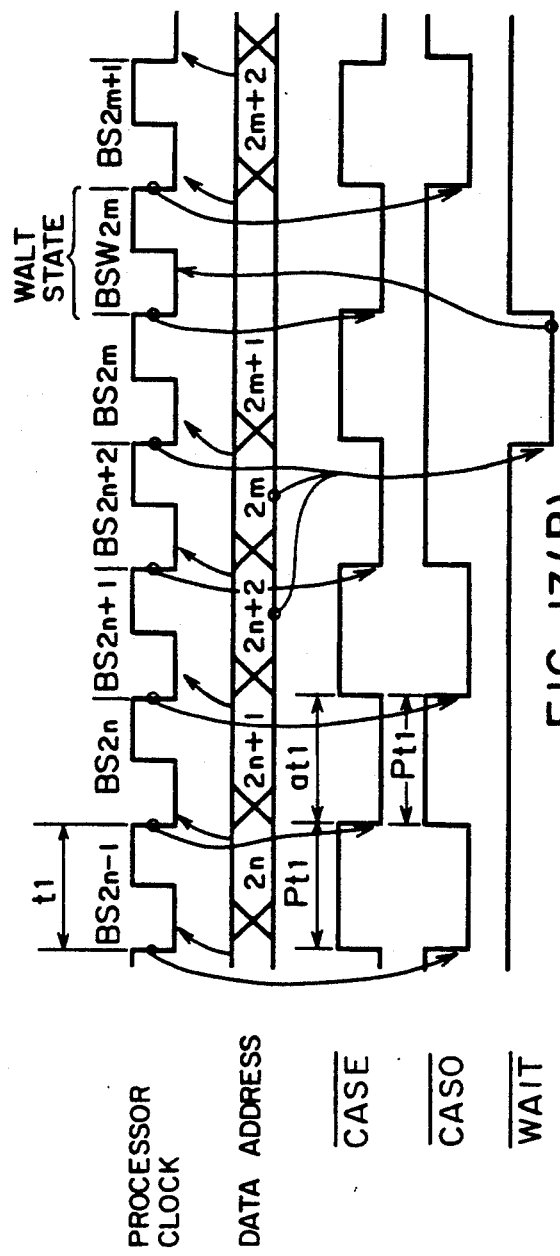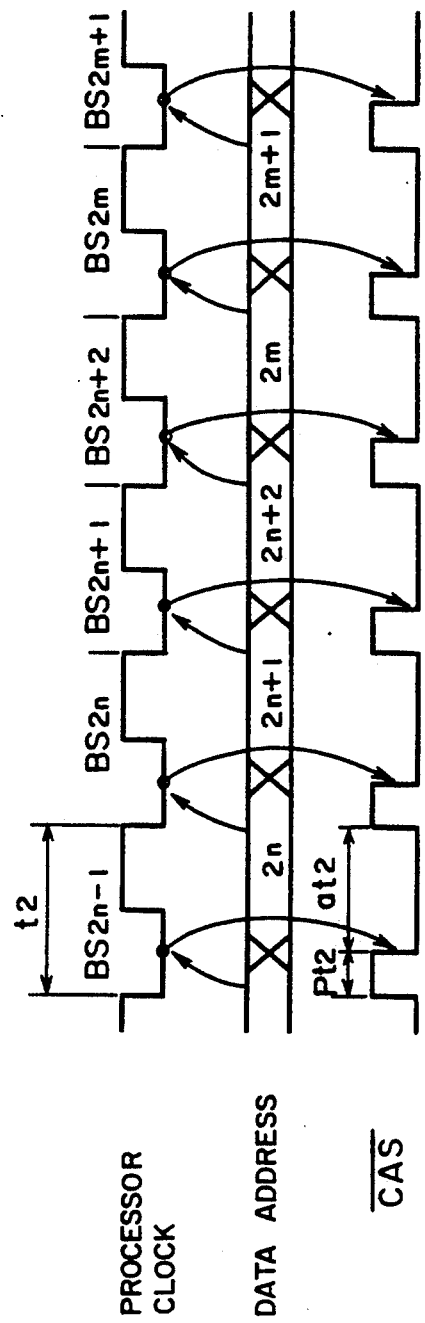
FIG. 13(A)
FIG. 13(B)

MEMORY DEVICE HAVING REFRESH MODE RETURNING PREVIOUS PAGE ADDRESS FOR RESUMED PAGE MODE

This application is a continuation of application Ser. No. 07/329,306 filed on Mar. 27, 1989 abandoned.

BACKGROUND OF THE INVENTION

This invention relates to a memory device, more particularly to a memory device which enables high-speed accessing of a memory system comprising dynamic random access memories (DRAMs).

The conventional system for reducing the access time of the high-capacity memory of a high-speed processor uses a cache memory and a high-speed buffer. The high-speed buffer is positioned between a high-capacity memory system constituted of a DRAM and the processor and serves as an access device for the cache memory. Techniques regarding access of such a cache memory can be found, for example, in Japanese Laid-open No. JP-A-62197842.

The conventional techniques are based fundamentally on the use of a buffer system for speeding up memory access. While they operate with good effect with respect to programs and data which are run or used over long periods of time, they degrade the real-time throughput when used with a system which includes many dynamic implementations in which dynamic factors arise frequently, such as when there are recurrent interruptions accompanied by frequent switching among programs and data. Moreover, the use of a high-speed cache memory increases system cost and requires the use of complex access circuitry, which is also expensive.

SUMMARY OF THE INVENTION

The primary object of this invention is to provide a memory device enabling high-speed access even in a system including dynamic implementations involving frequent changes in program and data.

The invention achieves this object by providing a memory device comprising a plurality of dynamic random access memories (DRAMs) each including a plurality of memory cells disposed in an array and organized by page, the page-organized DRAMs being divided into a plurality of groups each constituted of pages for storing data which are unlikely to give rise to interference between pages, the DRAM of each group being constituted as a memory system which responds to page accessing (in the high-speed page mode, the static column mode or the nibble mode). The memory system comprises memory means responsive to an access designating a new page address of the memory system for storing an old page address, i.e. an address designated at least one access earlier; judging means responsive to the new page address access for judging whether or not the new page address designated by the access coincides with the old page address stored in the memory means; and paging access means for instructing the memory system associated therewith to conduct a page access in accordance with the old address if the judging means judges that the old and new page addresses coincide and to conduct a page access in accordance with the new address if the old and new page addresses do not coincide.

In accordance with one aspect of the invention, the page-oriented DRAMs are divided into at least two independent groups, one of which constitutes a memory system for storing instruction data in the form of data codes defining the processing operations of a processor connected with the dynamic memory device and the other of which stores data to be processed in accordance with the instruction codes, and the memory system of each group is provided with the memory means, the judging means and the paging access means.

The above and other features of the present invention will become apparent from the following description made with reference to the drawings.

BRIEF DESCRIPTION OF THE DRAWINGS

FIG. 13(A) is a time chart showing page access according to an embodiment of the present invention in which the dynamic memory systems divided into banks.

FIG. 13(B) is a time chart showing ordinary page access according to the present invention.

DESCRIPTION OF THE PREFERRED EMBODIMENTS

Figure 1:
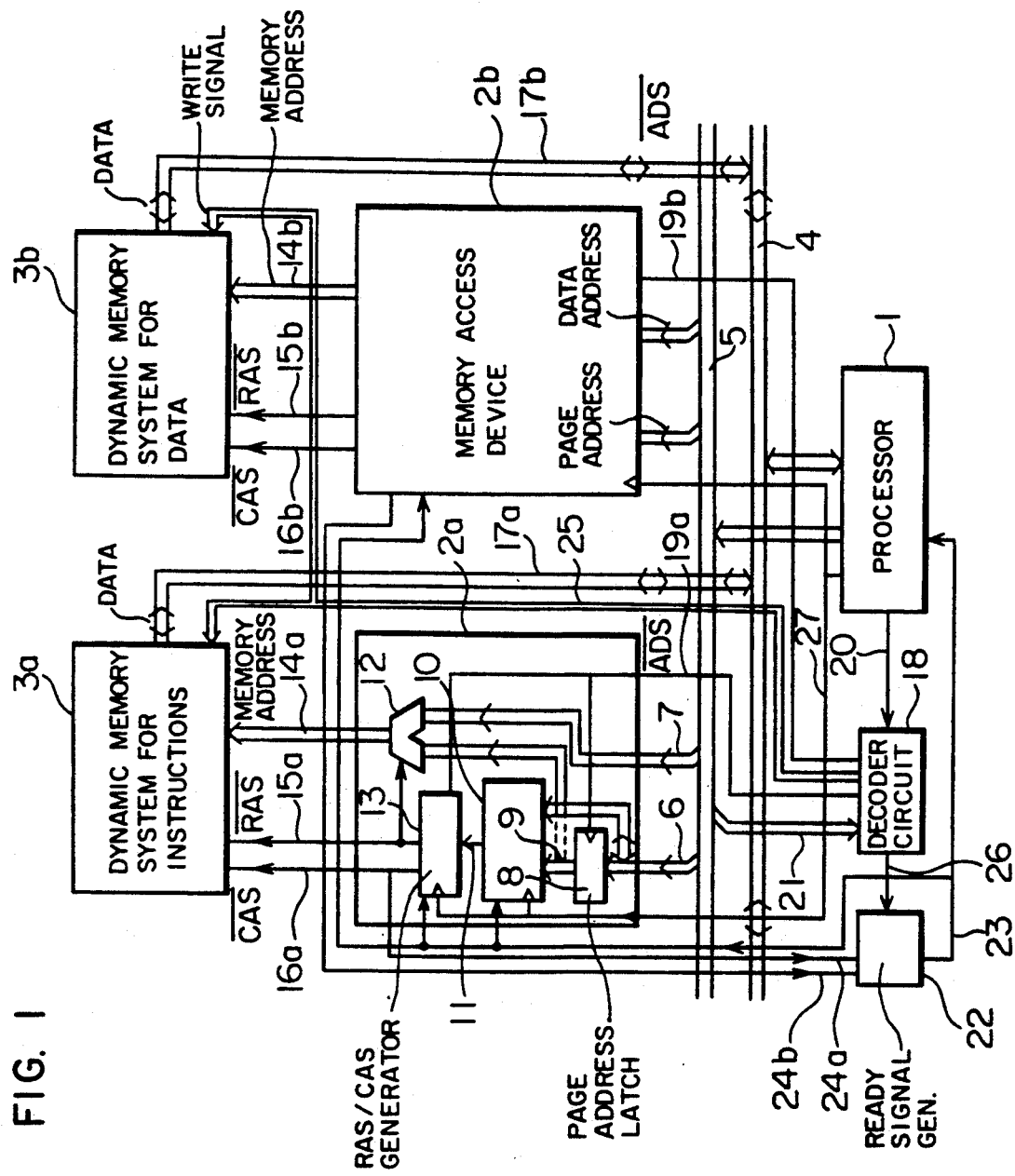
FIG. 1 is schematic view of a first embodiment of the memory device according to the present invention.

The invention will now be explained in detail with respect to the specific embodiments shown in the drawings.

In the embodiment of the invention shown in FIG. 1, the memory is divided into one section including a dynamic memory system 3a for instructions and a memory access device 2a and another section including a dynamic memory system 3b for data and a memory access device 2b. A processor 1 supplies each section with data via a data bus 4, addresses via an address bus 5, clock signals via a clock line 27, and control signals via a control line 20 and a decoder circuit 18.

Each of the dynamic memory systems 3a, 3b is constituted of a plurality of DRAM groups, each of which consists of a plurality of memory cells arrayed in the form of a matrix and is organized in page units. Each system responds to page accessing and is used to store instructions or data which are unlikely to cause access interference between pages. More specifically, in the present embodiment, the page-unit DRAM groups are divided into two sets forming the dynamic memory systems 3a, 3b which respond to page accessing and each group is used to store programs or data which entail little probability of access interference between the pages thereof. What this means is that it does not matter whether inter-page interference arises frequently between the two memory systems 3a and 3b. The programs and data which are likely to give rise to inter-page interference are separated from each other into two groups and one of these groups is assigned to each of the memory systems. In the present embodiment, for example, instruction data, i.e. instruction codes, to be executed by the processor 1 can be stored in memory system 3a and data which is to be processed according to the instruction codes can be stored in the memory system 3b. Moreover, with regard to the data in each memory system, the high order address is assigned as the page address (row address) and the low order address is assigned as the data address (column address).

Among the various DRAM access modes, the term "page access" is defined here as including the high-speed page mode, the static column mode and the nibble mode. In other words, the term is defined as referring to cases in which the row address given to the page address is fixed and data in one and the same page can be accessed at high-speed merely by changing the data address given to the column address. While the effect of the present invention is manifested in the modes which enable random access, namely the high-speed page mode and the static column mode, it also encompasses the concept of using the nibble mode for consecutive access using consecutive addresses, as in fetching instruction data (an example being access of the dynamic memory system 3a used for storing instructions in the present embodiment). The following explanation will be made based on use of the high-speed page mode as the typical type of page access.

The memory access devices 2a, 2b, are each constituted of a page address latch 8 serving as a memory means, a comparator 10 serving as a judging means, a multiplexer 12 and RAS/CAS generator 13. (As the memory access devices 2a, 2b are identical in function, only 2a is shown in detail in the figure.)

The page address latch 8 receives page addresses 6 output on address bus 5 by the processor 1 (which is the instruction means) at the time of access and latches the currently indicated page address (new page address) at the time an address strobe signal $\overline{ADS}$ 19a rises. Specifically, until the rise of the address strobe signal $\overline{ADS}$ 19a, the page address latch 8 latches the previously accessed page address (the old page address) 6. When the new page address has been latched, the old page address is transferred to the comparator 10 as old page address 9. The comparator 10 compares the old page address 9 and the new page address 6 and judges whether or not the two addresses coincide. If they are found to coincide, a high-level comparison signal 11 is output and if they are found not to coincide a low-level comparison signal 11 is output to the RAS/CAS generator 13. Based on the new page address 6 from the processor 1 and the comparison signal 11, the RAS/CAS generator 13 outputs a $\overline{RAS}$ signal 15a and a $\overline{CAS}$ signal 16a synchronously with the $\overline{RAS}$ and $\overline{CAS}$ timing thereof. (The timing and logic state of the rise and fall of the $\overline{RAS}$ signal and the $\overline{CAS}$ signal in this embodiment are in accord with the AC timing prescribed for standard dynamic memory ICs.) The multiplexer 12 receives a data address 7 and the new page address 6 and, using the period during which the $\overline{RAS}$ signal 15a is HI level or the period during which the $\overline{CAS}$ signal 16a is LO level, selects the new page address 6, which it outputs as memory address signal 14a when the $\overline{RAS}$ signal 15a falls, this output being timed for when latching by the dynamic memory system 3a is possible. It also uses the period during which the $\overline{RAS}$ signal 15a is LO level or the period during which the $\overline{CAS}$ signal 16a is at HI level for selecting data address 7, which it outputs as the memory address signal 14a when the $\overline{CAS}$ signal 16a falls, this output being timed for when latching by the dynamic memory system 3a is possible. Thus the multiplexer 12 receives the $\overline{RAS}$ signal 15a and changes the memory address signal 14a sent to the dynamic memory system 3a, meaning that the multiplexer 12 and the RAS/CAS generator 13 together constitute a paging access means.

In this embodiment the page address 6 sent from the processor 1 as the new page address is input directly to the multiplexer 12. However, insofar as it is possible to latch the page address 14a as output to the dynamic memory system 3a when the $\overline{RAS}$ signal 15a falls, the new page address 6 may be latched by the page address latch 8 upon detection of non-coincidence between the pages by comparator 10 and then the output signal (indicated by broken lines within memory access device 2a) output by the page address latch 8 is forwarded to the multiplexer 12 as the new page address data. Further, where a memory access cycle is constituted by a pipeline bus cycle (to be explained later), it becomes necessary to provide a latching means for provisionally latching the address information 6 and 7 being output by the processor in advance and then to transfer the page addresses and data addresses latched by the latching means to the multiplexer 12. For latching of the new page address 6 at this time it is possible to make use of the latching means used for latching the page address 9.

The $\overline{CAS}$ signal 16a is used for terminating access. This signal is also transferred to a READY signal generator 22 as a termination request signal 24a and, on the basis of thereof, a $\overline{READY}$ signal 23 is output to the processor 1 at an appropriate time, thus notifying the processor 1 of the termination of the bus cycle.

The decoder circuit 18 receives a control signal 20 from the processor 1 and an address signal 21 from the address bus 5. It decodes the address signal 21 into address strobe signals $\overline{ADS}$ 19a and 19b for the memory access device 2a and memory access device 2b, respectively, and outputs them to these devices if the processor makes a request to access the dynamic memory systems 3a and 3b. In the present embodiment, the decoder circuit 18 also serves to send to the dynamic memory systems 3a, 3b a write signal 25 indicating a write instruction issued by the processor. It further outputs to the $\overline{READY}$ signal generator 22 a signal 26 indicating whether or not the bus cycle is being executed.

The memory access device 2b and the dynamic memory system 3b have the same functions as the memory access device 2a and the dynamic memory system 3a and each pair of devices is capable of independent access operation.

The operation when the new page address 6 and the old page address 9 do and do not coincide will now be explained with reference to FIG. 2.

Figure 2:
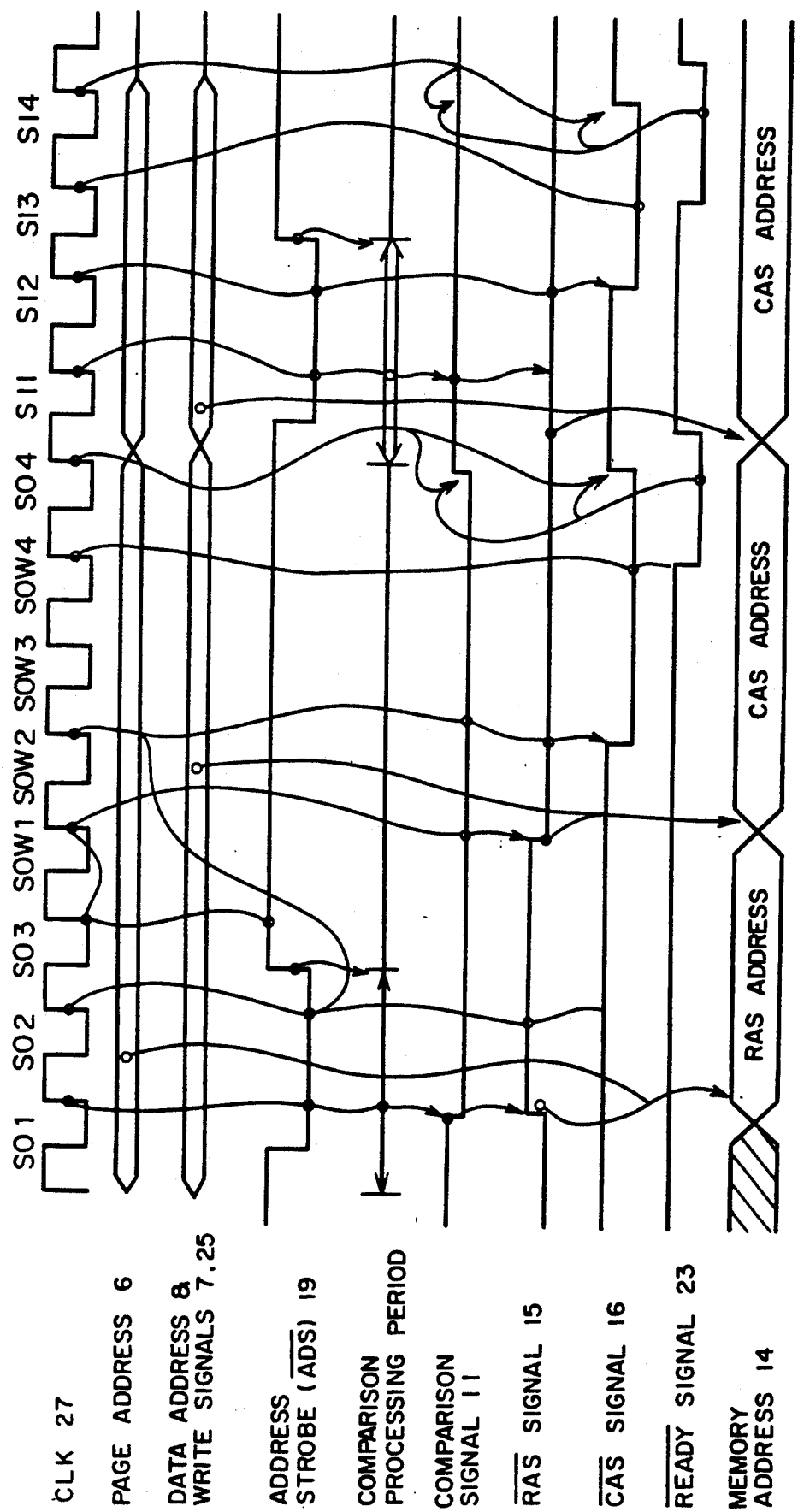
FIG. 2 is a time chart for explaining the operation of the memory device of FIG. 1.

In FIG. 2, states SO1–SO4 show the case where the old page address 9 indicated one access earlier and the new page address 6 of the current access are different. That is, they show the operation timing in the case where the new page address 6 and the old page address 9 were judged to be different when compared in the comparator 10. The valid comparison period of the two addresses is from the time a new page address 6 is output by the processor 1 to the time of the rise of the address strobe signal $\overline{ADS}$ 19, which is the time when this address is latched by the page address latch 8. In other words it is the time between the beginning of state S1 and the rise of state SO3.

When, in accordance with the program, the processor 1 outputs the address strobe signal $\overline{ADS}$ 19a between the rise of state SO1 and the rise of the state SO3, then at that time, within the active period that this signal is LOW level, at which time the comparator 10 provides a correct comparison result, namely at the time of the rise of state SO1, the result of the comparison is latched and the comparison signal 11 is output. More specifically, in accordance with the access by the processor 1, the page address comparator 10 compares the new page address 6 and the old page address 9, and a HIGH level comparison signal 11 is output if the result of the comparison is "coincidence" and a LOW level comparison signal 11 is output if the result is "non-coincidence." And, if the comparison shows non-coincidence, the LOW level comparison 11 signal is output at the rise of the SO1 state. In the case the comparison signal 11 is LOW level at the time that the state signal SO1 rises, the RAS/CAS generator 13 changes its $\overline{RAS}$ signal 15 to HIGH level. (If the $\overline{RAS}$ signal 15 is HIGH level at the time the state SO2 falls, the RAS/CAS generator 13 maintains the $\overline{CAS}$ signal 16 at HIGH level.) On the other hand, the $\overline{RAS}$ signal 15 falls to LOW level after the lapse of a sufficient precharge time. In this case, the $\overline{RAS}$ signal 15 stays high over the period of three clock pulses, which is to say that it falls to LOW level at the rise of SOW1. One clock pulse later the $\overline{CAS}$ signal 16 falls to LOW level. Following the output of this $\overline{CAS}$ signal 16, at the time the state SOW4 falls, the READY signal generator 22 outputs the $\overline{READY}$ signal 23 to the processor 1 and the memory access device 2a. As a result, the bus state is terminated at the rise of state SO4, at which time the comparison signal 11 reverts to HIGH level and the $\overline{CAS}$ signal 16 also goes back to HIGH level (the non-active state). (The $\overline{RAS}$ signal 15 is maintained at LOW level.)

Thus in the case of non-coincidence of the page addresses, since there is required a RAS precharge period (from the start of state SO2 to the rise of SOW1), the present embodiment requires the four clock pulse wait state SOW1-SO4 for satisfying the access time of the dynamic memory system 3a. In other words, when the page addresses coincide, the data address (CAS address) 7 is transferred the dynamic memory system 3a for page mode access in accordance with the old page address 9, but when the page addresses do not coincide, the transfer of the data address 7 is delayed by the duration of the RAS precharge period.

An explanation will now be given with reference to states S11-S14 regarding the case where the page addresses coincide, namely, where the new page address 6 and the old page address 9 coincide. In this case, the valid comparison period of the two addresses is from the time a new page address is output to the time of the rise of the address strobe signal $\overline{ADS}$ 19.

When the judgment of the page address comparator 10 is that the two page addresses coincide, the comparison signal 11 is already HIGH level at the time of the rise of state S11. That is, the comparison signal 11 which became HIGH level at the time of the rise of the state SO4 is maintained HIGH level at the time of the rise of state S11. Further, the $\overline{RAS}$ signal 15a is maintained at LOW level. Then at the time the state following state S12 rises, the $\overline{CAS}$ signal 16a becomes LOW level. Following the output of this signal to the READY signal generator 22, the $\overline{READY}$ signal 23 becomes LOW level at the time the state S13 rises and the bus cycle is terminated at the time the state S14 rises.

There is thus no wait state processing when the page addresses coincide and page mode access is executed in accordance with the old page address 9. In other words, the page address is fixed and the access is conducted in accordance with the data address (CAS address).

It should be noted that the address output as the memory address signal 14a is the new page address 6 when the $\overline{RAS}$ signal 15a is HIGH level and is the data address (CAS) 7 when the $\overline{RAS}$ signal 15a is LOW level. As a result, the dynamic memory system 3b is able to latch the required memory address at the fall of the $\overline{RAS}$ signal 15a and the $\overline{CAS}$ signal 16a.

While the page access system used in this embodiment has been explained above with reference to the dynamic memory system 3a and the memory access device 2a as an example, it should be understood that dynamic memory system 3b and the memory access device 2b function in the same manner.

Figure 3:
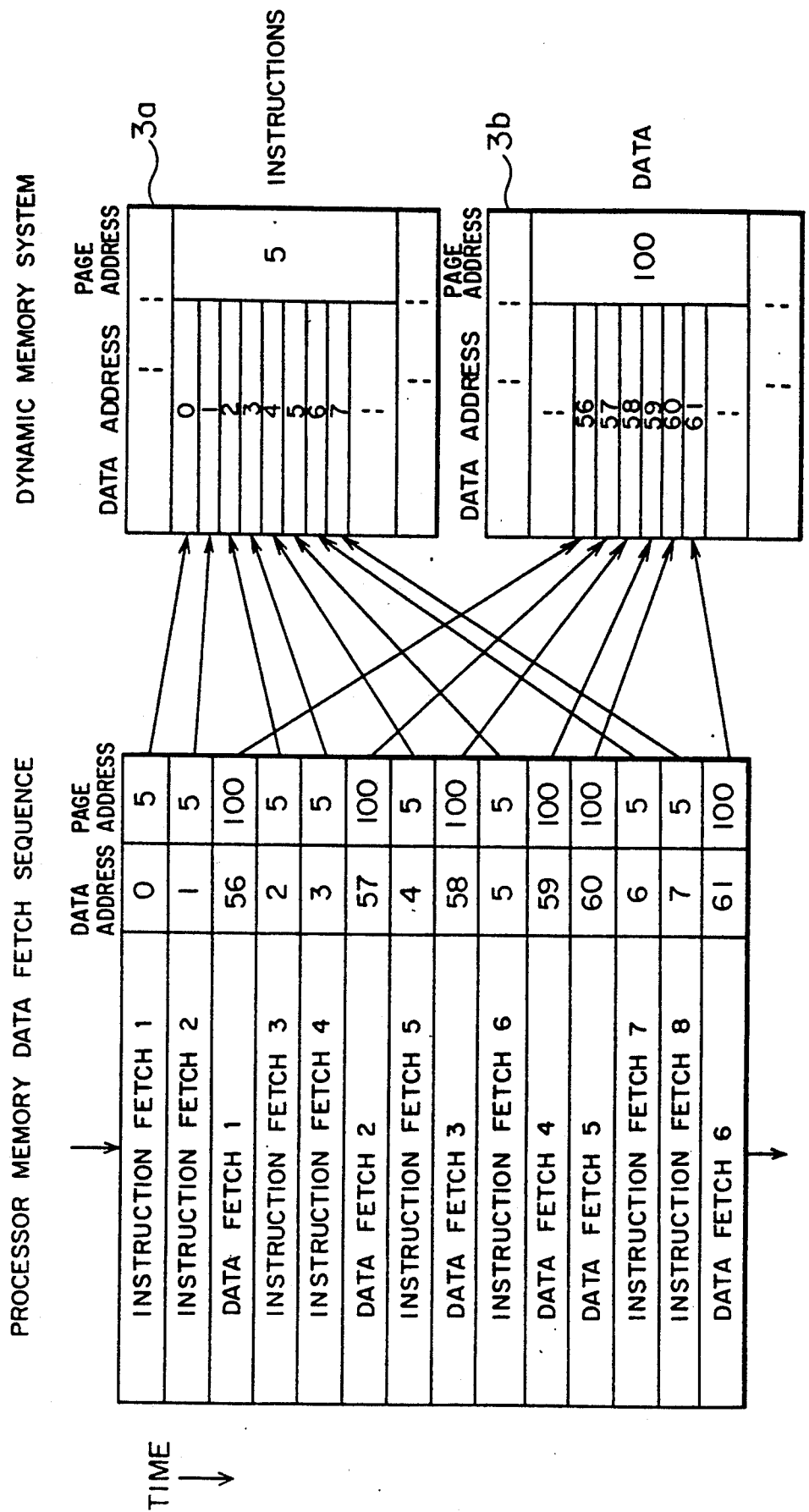
FIG. 3 is a diagram illustrating the effect of the memory device of FIG. 1.

The effect obtained in the present embodiment by providing a plurality of independent dynamic memory systems (3a, 3b) and memory access devices (2a, 2b) will now be explained with reference to FIG. 3.

First, consider what the situation would be if all of the DRAM should be grouped together and handled by a single memory access device. Presume, for example, that the page address is designated as 5, 100 and a memory data fetch sequence designating 0-7, 56-61 as the data address is executed. In this case, inter-page interference would occur with every change of page address, with the result that a large number of wait states would be inserted and the processing speed of the processor 1 would be markedly reduced. In contrast, in accordance with the present embodiment, one group of data unlikely to give rise to inter-page interference among the elements thereof (e.g. instruction data constituting instruction codes defining the processing operations of the processor 1) is stored in the dynamic memory system 3a, and the operand data to be processed in accordance with the instruction codes are stored in the dynamic memory system 3b. While there are two types of memory data, the instruction data and the operand data, and instruction fetches and data fetches are mixed together in the fetch sequence, the addresses at which the instructions reside are generally separated. Therefore, the probability of instruction data and operand data being located at different page addresses is high. If both kinds of data should be stored together in the same dynamic memory system, page non-coincidence would occur frequently during page access. This increases the page switching overhead and has a high possibility of degrading system performance. Therefore, the instruction data is selected as the first group of data which is unlikely to give rise to inter-page interference and this instruction data is assigned to the dynamic memory system 3a (the dynamic memory system for instructions) while the operand data is selected as the second group of data and stored in the dynamic memory system 3b (the dynamic memory for data). In this way the data which is likely to give rise to page address interference is lumped in a separate group. In executing the memory data fetch sequence shown in FIG. 3, therefore, designating 5 as the page address will result in an access of the dynamic memory system 3a being executed, whereas designating 100 as the page address will result in an access of the dynamic memory system 3b being executed. In either case, the page address is fixed and the access is conducted in accordance with the data address. As a result the page address comparator 10 of the memory access device 2a will continue to latch the page address 5 over a long period, while the page address comparator 10 of the memory access device 2b will continue to latch the page address 10 over a long period. This makes it possible for both memory systems to access data in zero wait states.

In this way, by arranging the dynamic memory system such that data which is unlikely to be a cause of inter-page interference are collectively assigned to one group and accessing both of the memory systems by page mode access, higher speed random accessing, similar to that in a cache memory, can be realized. One reason for this is that, as in the present embodiment for instance, different instruction data are very likely to be located in the same address area and different operand data are also very likely to be located in the same address area. Another is that there is a high probability of the processor repeatedly handling the same data within the processing sequence so that almost all inter-page interference arises within the respective groups of data. Thus if the page address space per page is adequately large, the probability of non-coincidence between page addresses occurring becomes exceedingly small, meaning that the dividing of the dynamic memory system into groups in the manner described above is highly effective for speeding up the system.

The conventional high-speed buffer techniques employing a cache memory are not suitable for use in the case of control systems, automatic machine controllers and other applications wherein interruptions and other dynamic factors cause frequent changes in the processing program. This is because of the large overhead resulting from the need to reload instructions and data. In contrast, while in the method of the present embodiment there is an overhead of four machine states (100 ns if a single state is presumed to be 25 ns) only when the page address changes. However, since the probability of the page address changing is very small, most operations can be executed at zero wait state, making it possible to provide adequate real-time access performance.

Further, since the embodiment described above has no need for a high-speed buffer, the memory system can be realized at very low cost.

Regarding access control of the dynamic memory system, it is necessary to conduct, among others, refresh control and the RAS precharge control necessitated by the limitation on the page access mode imposed by causes on the dynamic RAM side. The means for providing these functions can be provided externally of the access devices 2a, 2b or they can be provided internally. If they are provided externally, it becomes necessary to provide the memory access devices 2a, 2b with the capability of causing the $\overline{RAS}$ signal 15 to rise upon receiving a refresh request from the outside. For this it is effective to supply a refresh address in place of the new page address 6 during this period, and, after the lapse of a sufficient $\overline{RAS}$ precharge time, to cause the dynamic memory systems 3a, 3b to latch the refresh address at time of the fall of the $\overline{RAS}$ signal. Similarly, return to the ordinary bus cycle from the refresh cycle can be carried out by first allowing a sufficient RAS precharge time to lapse and then moving into the page access mode by causing the dynamic memory systems 3a, 3b to latch the page address to be accessed at the time of the fall of the $\overline{RAS}$ signal 15. On the other hand, where the means are provided internally, it becomes possible to integrate all functional means required for accessing the dynamic memory system, including the circuit for generating refresh addresses, on one or more IC chips. In this case, the overall system integrated on the IC chip or chips can be of the arrangement shown in FIG. 1.

A description has been given of an example of the arrangement used in accordance with the present invention in the case where the high-speed page mode is used for page access. As was mentioned earlier, the presently available page access modes for DRAM include the static column mode and the nibble mode, in addition to the high-speed page mode. In the static column mode the $\overline{RAS}$ signal control is the same as that in the high-speed page mode but there is no need to have the $\overline{CAS}$ signal cause the dynamic memory system to latch the data address. On the other hand, however, at the time of reading data it is necessary to hold the data address signal long enough for identification of the data to be read, and for writing data it is necessary to provide in the memory access device of the dynamic memory system concerned a circuit for applying a write pulse to the target memory cell when the target dynamic memory system is accessed. Further, while static column mode accessing is in progress, the $\overline{CAS}$ signal has to be maintained at LOW level, and it is not possible to use the arrangement of the present embodiment wherein a direct $\overline{CAS}$ signal applied to the memory system is used for producing a $\overline{READY}$ signal which indicates termination of the bus cycle. It is therefore necessary to generate a signal with a function similar to that of the $\overline{CAS}$ signal of the present embodiment (namely a signal representing the fact that access of the memory has begun in the bus cycle concerned) and to supply it to the READY signal generator 22.

Page access using the nibble mode is fundamentally the same as page access using the high-speed page mode except that no need arises for supplying a data address to the dynamic memory system at any time other than immediately after a page address change. Therefore, the system and signal timing of the present embodiment can be used basically as they are. However, it should be noted that in the nibble mode the data addresses are produced automatically by an upcounter within the dynamic memory (DRAM) IC so that the data addresses can only be selected consecutively. As a result, where the data is arranged consecutively as in the case of instruction data, arrayed data and the like, the nibble mode can effectively be used in the manner of burst transmission. It is not suitable for use in random access, however. Further, where the memory addresses to be accessed are non-consecutive, it is necessary to deem that non-coincidence of pages has occurred even though this is not actually the case. This makes it necessary to provide each of the memory access devices with a means for judging whether the data address in the dynamic memory system which the processor 1 is trying to access is the same as the data address accessed in the dynamic memory concerned one time earlier after this latter data address is incremented by one, and the memory access devices have to be arranged so that when the two are found not to be the same, an access cycle the same as that in the case of page non-coincidence is put in operation.

Next, examples of system configurations using a dynamic memory device 112 according to this invention will be explained.

Figure 4:
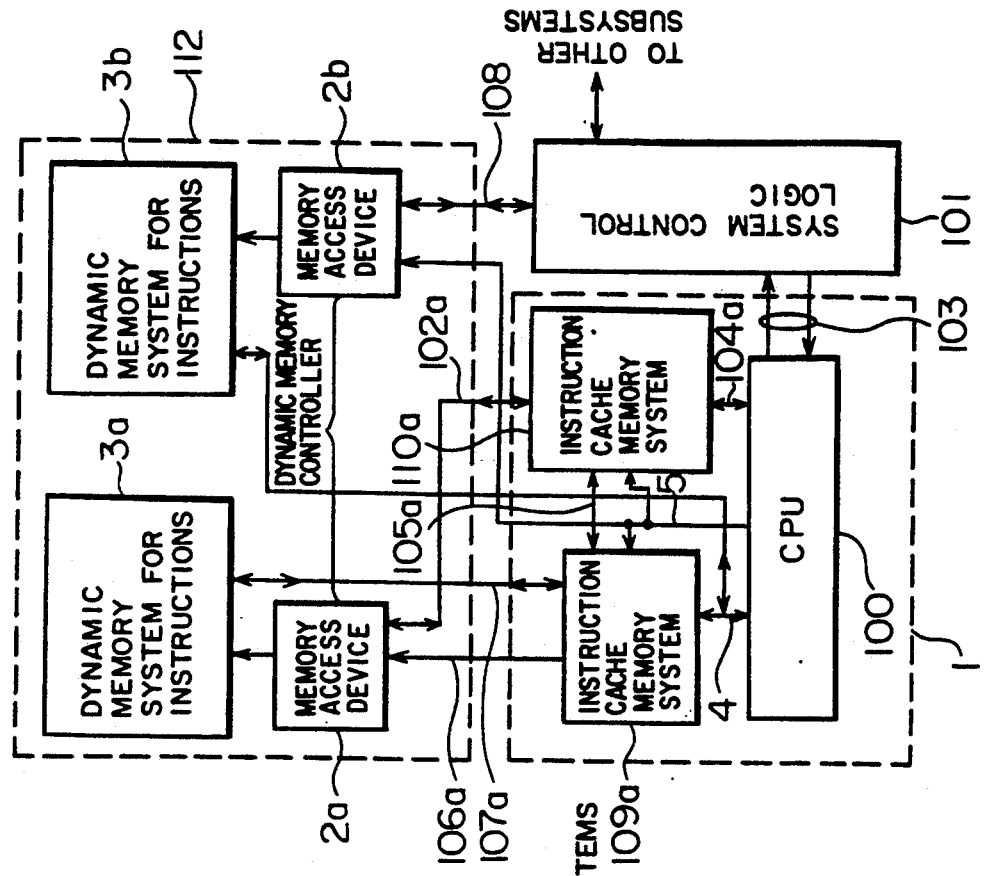
FIGS. 4-12 are schematic views of other embodiments of the memory device according to the present invention.

FIG. 4 shows an example in which the processor of the embodiment of FIG. 1 is constituted simply as a CPU 100. In this configuration, the address bus 5 provides direct input from the CPU 100 to the memory access devices 2a, 2b according to the present invention and the data bus 4 connects the CPU 100 directly with the dynamic memory systems 3a, 3b according to the invention. As in the embodiment shown in FIG. 1, the instruction data (first data group) and the operand data (second data group) between which inter-page interference is likely to arise are stored separately in the dynamic memory systems 3a and 3b, respectively. As this makes it possible to reduce inter-page access interference to an extremely low level and to reduce overhead resulting from page non-coincidence to the very minimum, high-speed access of the dynamic memory system in the page access mode can be carried out at a constant rate. A signal line 108 for the dynamic memory system access request signal (ADS) and for exchanging access start signals with the memory access devices 2a, 2b is connected with a system control logic 101 which includes the decoder circuits and the READY signal generator. The system control logic 101 exchanges required address information and status information with the CPU 100 over a signal line 103. It also carries out such functions as generating the control signals required by other subsystems and obtaining and sending to the CPU information required from the other subsystems. The embodiment shown in FIG. 4, is the example of this invention having the simplest configuration and features very high cost/performance.

Figure 5:
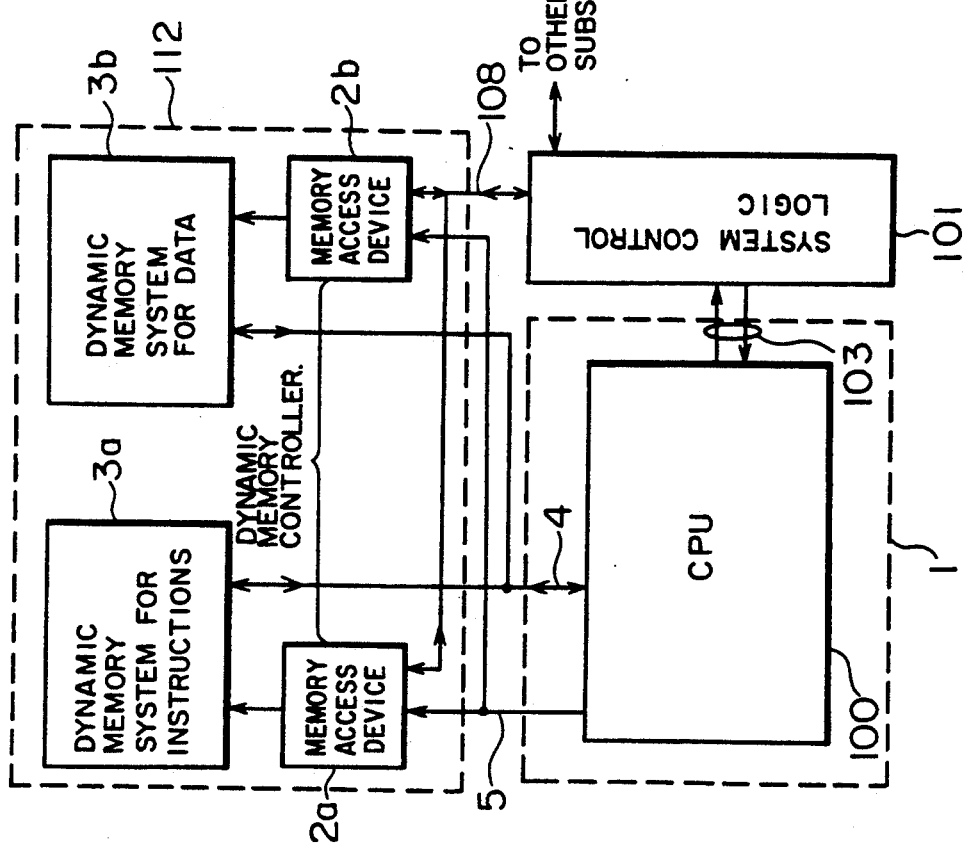

FIG. 5 shows an example of a system configuration in which the processor 1 of FIG. 1 includes therein an instruction cache memory 109a and an instruction cache memory controller 110a. The instruction cache memory controller 110a exchanges required address and status information with the CPU 100 via a signal line 104a, while the exchange of required information between the instruction cache memory 109a and the instruction cache memory controller 110a is conducted over a signal line 105a. Access of the dynamic memory system 3a and the memory access device 2a which controls the same (both of which are constituent elements of the present invention) is conducted over a control signal line 102a by a main memory physical address 106a which is generated as a target address by the instruction cache memory 109a and the instruction cache memory controller 110a at the time of a cache memory mishit, a signal 107a for input/output of data to/from the cache memory and an access request ADS with respect to the memory access device 2a. On the other hand, access of the dynamic memory system 3b and its memory access device 2b is conducted directly by the CPU 100 as in the case of the configuration of FIG. 4. While the configuration of FIG. 5 provides substantially the same effect as that of FIG. 4 it has the additional aim of speeding up data transfer between the instruction cache memory 109a and the dynamic memory system 3a, which constitutes the main instruction memory system with respect thereto. While the configuration of FIG. 5 is well matched to the present invention, the incorporation of the instruction cache memory makes its real-time throughput inferior to that of the configuration of FIG. 4 as regards dynamic processing operations. Where it is possible to constitute the instruction cache memory 109a as a static memory which has considerably faster access time than the page access mode of the dynamic memory system, this configuration enables the CPU to be operated at a higher frequency.

Figure 6:
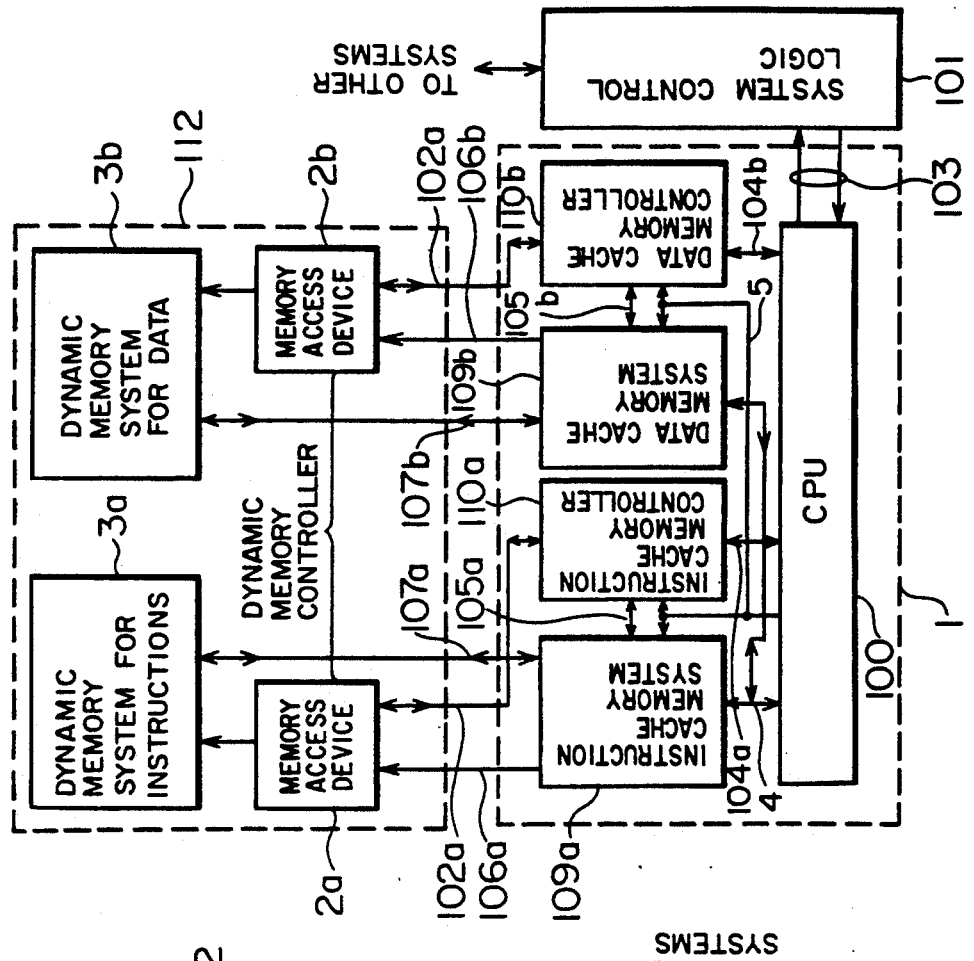

FIG. 6 shows an example of a system configuration in which the processor 1 includes therein a single cache memory system 109 which stores not only instruction data but also operand data mixed in therewith and a cache memory controller 110, and the arrangement is such that the CPU 100 always accesses the cache memory system 109. The cache memory system within the processor is of the classical, ordinary type long used in the field. In the illustrated configuration, the dynamic memory device 112 of the invention serves as the main memory system. At the time of a cache memory mishit, connection with the CPU is established through the cache memory system 109 and the cache memory controller 110 via a signal line 106 for supplying the physical address at which the target data is located in the main memory, a signal line 107 for exchanging the target data, and a signal line 102 for exchanging control signals. Where the cache memory is constituted using a static memory (SRAM) fabricated by a production processes equivalent to that used for the fabrication of the DRAM used in the dynamic memory, the configuration of FIG. 6 provides no superiority in access time speed over the configuration of FIG. 4 without a cache, insofar as the application is limited to the present invention. From the point of real-time processing performance, therefore, the configuration of FIG. 4 is, as was pointed out earlier, much more advantageous. On the other hand, if the cache memory system 109 and the cache memory controller 110 are, together with the CPU 100, constituted as single-chip ICs, or if the cache memory system 109 is constituted using an especially fast SRAM, then, for the same reason as was mentioned in connection with the configuration of FIG. 5, it becomes possible to realize faster transfer of instruction and operand data between the main memory system 112 according to this invention and the cache memory system 109, making it possible to operate the CPU 100 at a higher frequency. As exchange of operand data is also carried out through the cache memory system 109, the configuration illustrated in FIG. 6 is inferior to that of FIG. 5 in real-time throughput.

Figure 7:
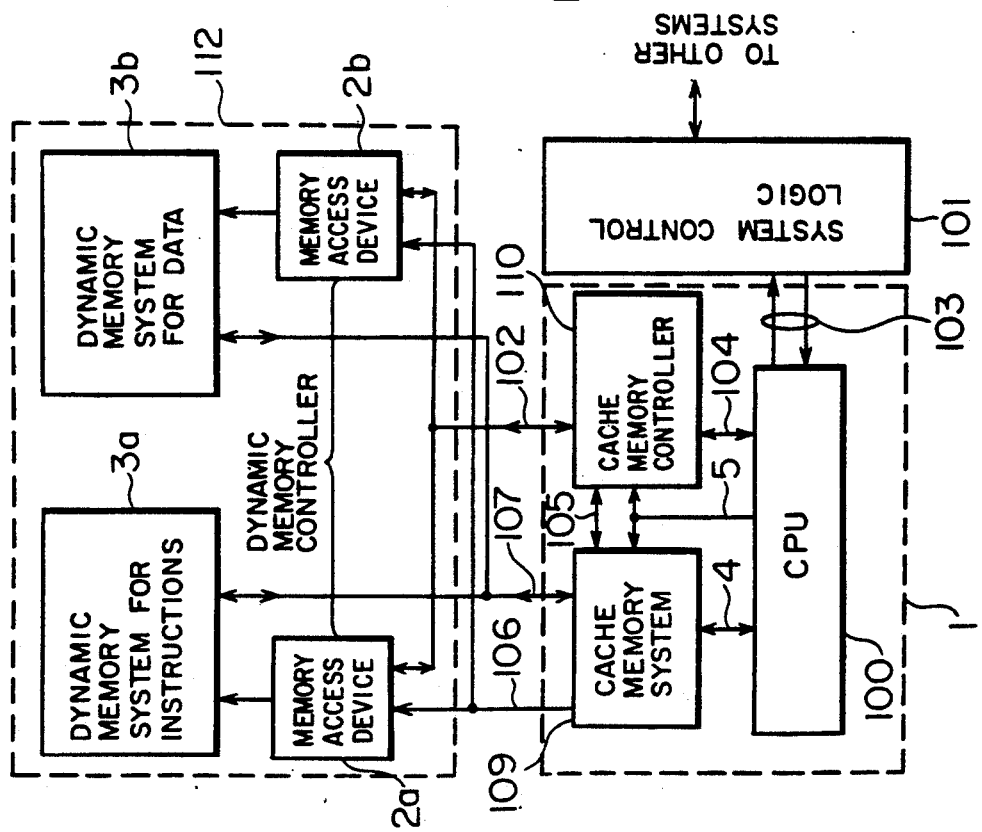

FIG. 7 shows an example of a system configuration in which the processor 1 includes therein an instruction cache memory 109a and a separate data cache memory system 109b. The basic system performance characteristics of this configuration are the same as those of the configuration of FIG. 6 except that the provision of the separate instruction cache memory 109a and data cache memory system 109b, together with independent cache memory controllers 110a, 110b provided for these, improves the hit rate of the CPU 100 with respect to the cache memory system. As a result better system performance can be expected. As regards connection with the dynamic memory device 112 of this invention, it suffices to connect the instruction cache memory 109a and the instruction cache memory controller 110 with the command dynamic memory system 3a and its memory access device 2a, and to connect the data cache memory system 109b and the data cache memory controller 110b with the data dynamic memory system 3b and its memory access device 2b. Thus the configuration can be said to have good connectability with the memory device according to this invention.

Figure 8:
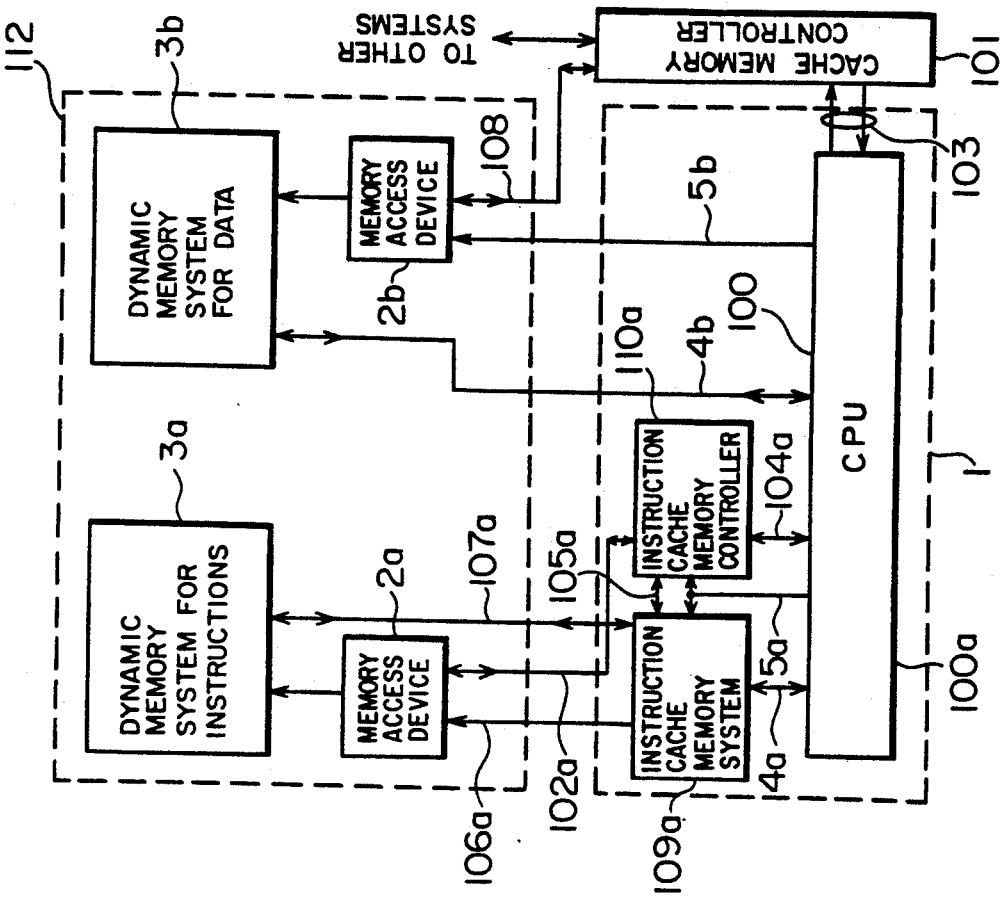

FIG. 8 shows an example of a system configuration in which the processor 1 is constituted solely as a CPU. Although the basic configuration and system performance characteristics are the same as those of the configuration of FIG. 4, there is a structural difference in that the CPU 100a has from the beginning two pairs of independent signal lines, the first pair consisting of an instruction fetch address signal line 5a and an instruction fetch signal line 4a and the second pair consisting of an operand data communication address signal line 5b and an operand data communication data signal line 4b. Therefore, when the CPU of this configuration is adopted for connection with the dynamic memory device according to the present invention, the signal lines 5a and 4a can be connected directly with the command dynamic memory system 3a and its memory access device 2a, while the signal lines 5b and 4b cab be connected directly with the data dynamic memory system 3b and its memory access device 2b. Thus the connectability with the memory device of the invention is exceedingly good. The advantages of the CPU system are:
- a) Exchange of operand data with the exterior and instruction fetching are executed in parallel so that an improvement can be realized in data communication throughput between the CPU and external systems.
- b) The instruction fetch cycle and the operand data read and write cycles are processed in parallel, ensuring smooth flow of instructions and data in the CPU, with the result that disturbance of pipeline processing in the CPU can be reduced to a very low level.

The effect of the advantage a) is that of enhancing the data communication throughput between the CPU and the exterior so that the amount of data that can be processed per unit time is increased and the performance of the CPU is improved. The effect of the advantage b) is that of increasing the processing efficiency in the CPU, in this way increasing the performance of the CPU. In either case, this configuration can be used as a method for upgrading the performance of the CPU itself and, as such, an increasing number of CPUs can be expected to adopt this architecture. The main merit which the present invention provides by separating the instruction and data dynamic memory systems is that of reducing overhead resulting from non-coincidence of pages addresses to the absolute minimum. This effect is essentially different from that realized by providing the CPU with separate signal lines for instructions and data. Notwithstanding, the combination of the dynamic memory device according to the present invention and the CPU 100a shown in FIG. 8 effectively integrates the advantageous characteristics of both and makes it possible to realize optimum performance for the system as a whole. The configuration shown in FIG. 8 is highly suitable for processing involving dynamic factors because the fact that the processing is conducted without going through a cache memory ensures the highest level of real-time throughput.

Figure 9:
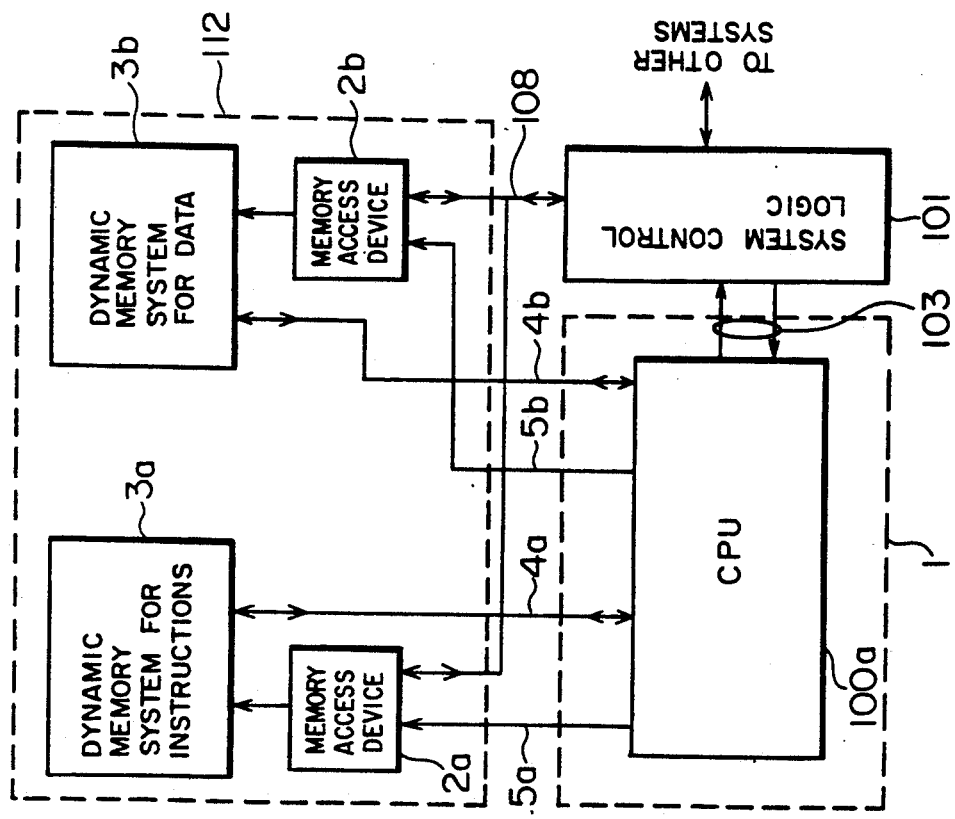

FIG. 9 shows an example of a system configuration using a CPU 100a having separate instruction and operand data signal lines in the configuration of FIG. 5. The basic system characteristics are the same as those of the example of FIG. 5, except that an improvement in the performance of the CPU itself can be realized. Thus, similarly to the case of the configuration of FIG. 8, a corresponding improvement in the system performance can also be obtained.

Figure 10:
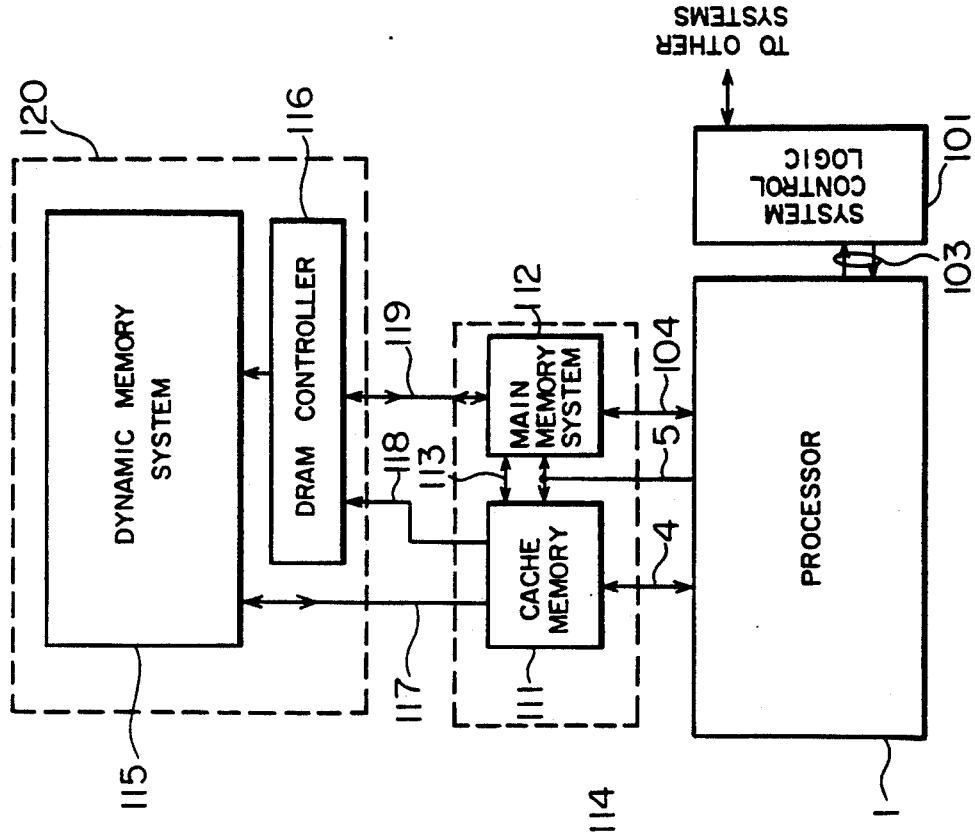

FIG. 10 shows an example of a system configuration which, similarly to the case of FIG. 9, also uses the CPU 100a, but as applied to the configuration of FIG. 7. Although the basic system characteristics are the same as those of FIG. 7, there can be realized an improvement in system performance proportional to the improvement in CPU performance. This configuration has the lowest real-time throughput. It is suitable for applications where, as in the case of mainframes, the emphasis is not so much on real-time throughput as on reducing the mean cycle time so as to realize as much improvement in mean throughput as possible.

Comparisons will now be made between conventional systems and systems adopting the present invention.

Figure 11:
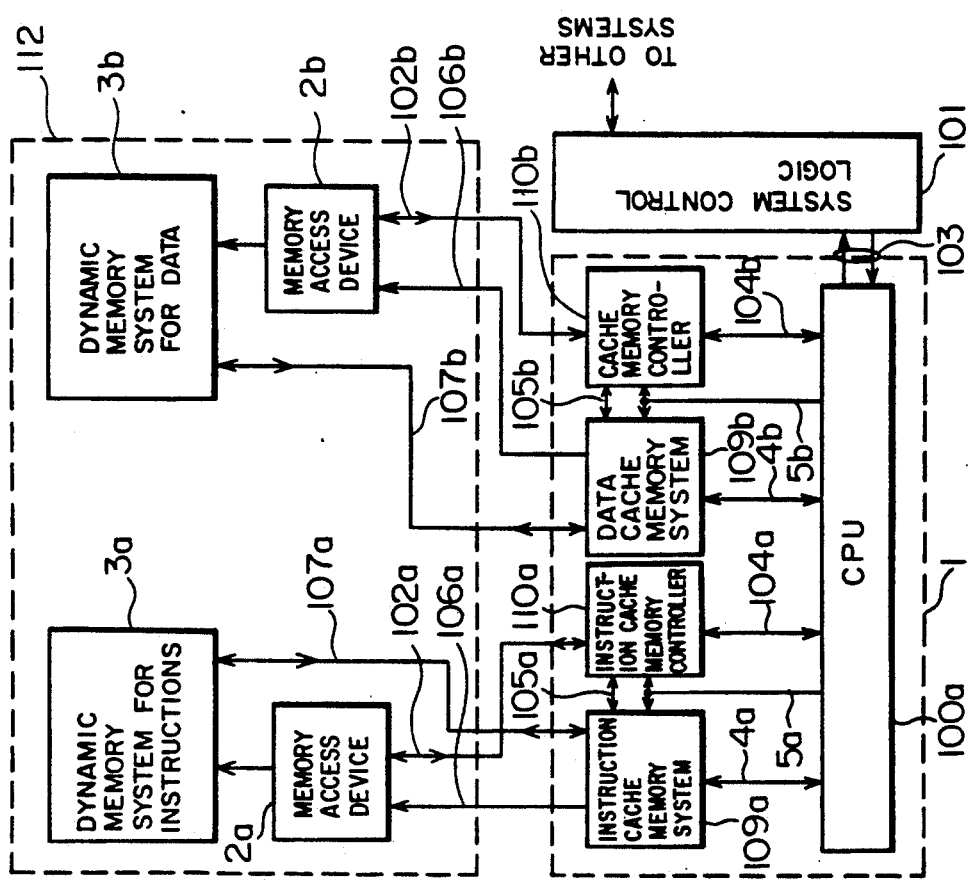

FIG. 11 shows an ordinary high-speed processing system which employs a cache system 114. The reference numeral 120 designates an ordinary main memory device, which is controlled by a DRAM controller 116. To make up for its slow DRAM access time, the system employs various techniques for speeding up the communication speed between the cache system (consisting of cache memory 111 and cache memory controller 112) and the main memory device. These include increasing the bit number and broadening the channel width of a bus 117 used for data communication, and, through the use of a number of banks, carrying out memory interleaving in combination with burst transfer. The processor 1 and the cache system are interconnected by a data communication line 4, an address signal line 5 and a control signal line 104. On the other hand, the cache system 114 and the main memory device 120 are connected by a data communication bus 117, a main memory physical address signal line 118 and a control signal line 119. If the cache memory is not built into the processor 1, random access communication is used between the processor 1 and the cache memory 114 and block data transfer is used between the cache system 114 and the main memory device 120. Where an additional cache memory system is included in the processor 1, it is highly likely that communication between the external cache memory system 114 and the processor 1 is carried out by data block transfer. Such a system employing a cache memory system cannot efficiently handle dynamic implementations for the following reasons:
- a) Since a cache memory is of very limited capacity, the probability that a particular program or particular data to be processed is not present in the cache memory increases dramatically when the job or data being processed changes dynamically and frequently (as in the case of interrupt processing and the like). This means that the need to access the main memory system arises frequently, which causes the overhead to become exceedingly large.
- b) When, as is the usual case, block data transfer is used between the cache memory system and the main memory, the processor is idle until the transfer of the prescribed block of data has been completed.
- c) The communication between the cache memory system and the main memory system is itself slow.

The present invention overcomes the problems a) c) as follows:
1) The present invention provides a solution to the problem a) by making it possible to access the main memory system with an access speed on a par with that of a cache memory, which makes it possible to eliminate the cache memory nearest to the main memory system. In the conventional system shown in FIG. 11 this means that the cache memory 114 can be eliminated so that the main memory system can be connected directly with the processor. It therefore becomes possible for the processor to random access a massive physical memory space.
2) The problem b) is solved since in the present invention the processor is able to random access the main memory system at a constant high speed, whereby the processing can be conducted continuously without interruption.

3) The problem c) is eliminated by the present invention since it becomes possible to realize an access performance in the main memory system comparable to that of a high-speed static memory, which enables high-speed data transfer between the processor and the main memory system without use of block data transfer or increase in the transfer bit number. If data is transferred between the main memory system and a cache memory in the processor, the transfer block can be made very small (ideally one word per block), thus increasing the real-time throughput.

An explanation will now be made on how the present invention can be applied for realizing operation of the memory device at higher frequency and for shortening the machine cycle of the processor it is used with.

Figure 12:
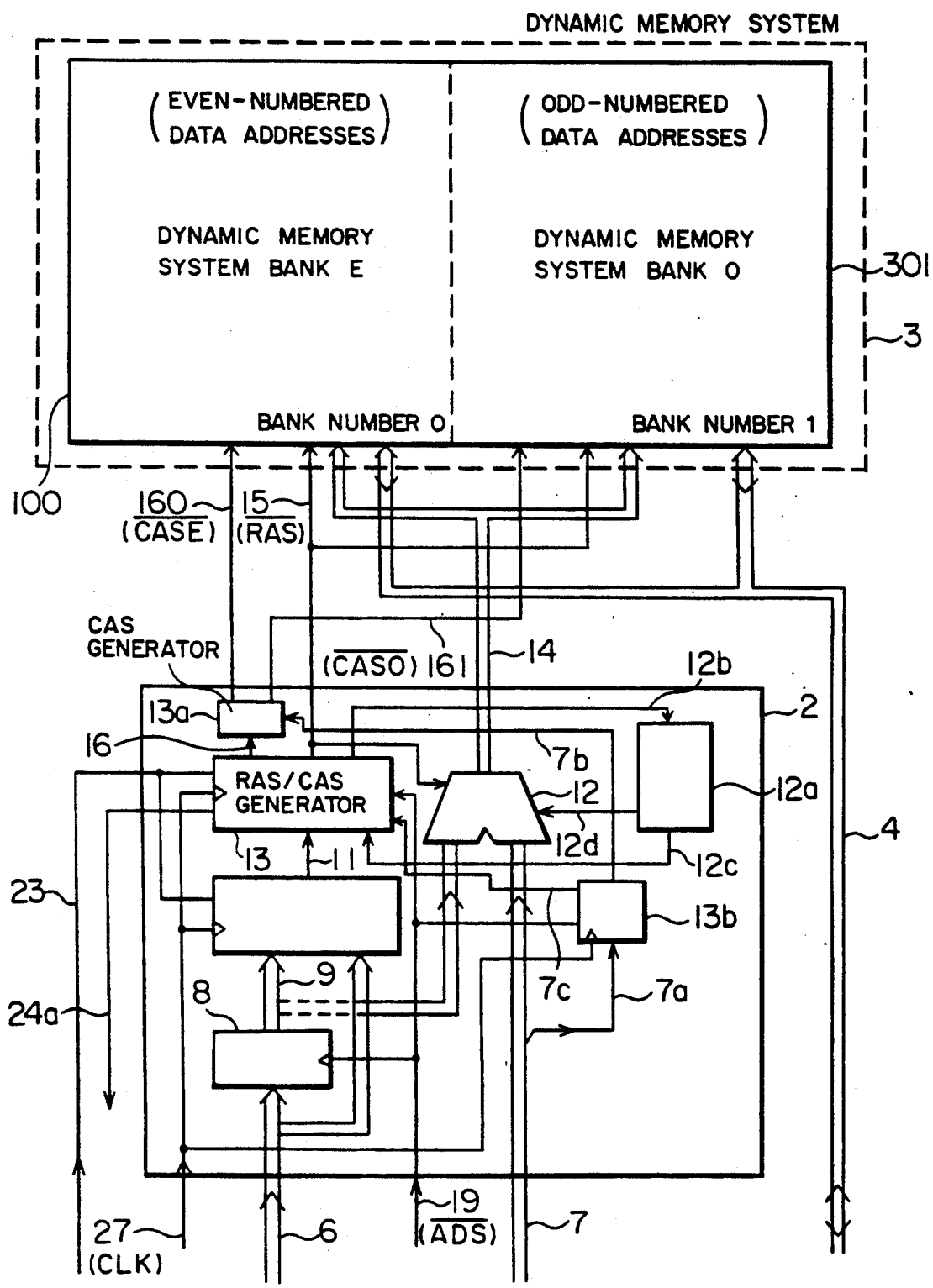

FIG. 12 shows a group (combination of a dynamic memory system 3 and one memory access device 2) of a memory device of the invention. The basic configuration is the same as that shown in FIG. 1, except for the fact that the dynamic memory system 3 is divided into two banks, bank E300 and bank o301. In line with this division, there are further provided a $\overline{CAS}$ generating means 13a for producing separate $\overline{CAS}$ signals ($\overline{CASE}$ and $\overline{CASo}$) for the respective banks E300 and o301 and a bank selection means 13b. In the present embodiment, the bank E300 is selected for access (is sent a $\overline{CASE}$ signal) when the data address 7 is even and the bank o301 is selected for access (is sent a $\overline{CASo}$ signal) when the data address 7 is odd.

The operation and effect of this embodiment will be better understood from FIG. 13(A) and 13(B). FIG. 13(B) shows the situation in the case of ordinary page access (in high-speed page mode) according to this invention. BS denotes the processor bus state and in this embodiment one bus cycle is equal to one processor cycle. Further, this embodiment relates to an application using a processor which conducts bus access using pipeline bus access. Pipeline bus access is an access system in which the address to be used in a given bus cycle is output in the preceding bus cycle (or processor cycle). The output address is latched and then used in the actual bus cycle. Use of this method makes it possible to take full advantage of the bus cycle time in carrying out access. With progressive reduction of processor machine cycle time, it will become increasingly difficult to secure adequate address access time when the address is output in the same bus cycle and because of this, it is expected that more and more processors will be employing pipeline bus cycle accessing in which the addresses are output within the preceding cycle. In the present invention, instructions and data which are unlikely to give rise to inter-page interference are clumped together in separate groups. For example, instruction data is put in one group and array variable data in another group, so that in each group there is a high probability of consecutive data being located in consecutive address space. More specifically, when the processor accesses the dynamic memory system to which a given group has been assigned, the probability is high that the even and odd numbered addresses will appear alternately. In the ordinary page accessing illustrated in FIG. 13(B), it is necessary within each bus cycle BS to secure a $\overline{CAS}$ signal precharge time (CAS precharge time) pt2 and an access time at2 during which $\overline{CAS}$ is kept active. The problem is that after the time pt2 has been secured, the time at2 cannot be made as long as required. This problem can be overcome by using the 2-bank system according to the present invention illustrated in FIG. 12. The time chart shown in FIG. 13(A) relates to page access according to the present embodiment. In a bus state having an even data address (m and n in the figure being integers), $\overline{CASE}$ 160 is made active whereas in a bus state having an odd data address, $\overline{CASo}$ 161 is made active. $\overline{CASE}$ 160 makes bank E300 of the dynamic memory system active whereas $\overline{CASo}$ makes bank o301 active. Since even- and odd-numbered addresses appear alternately from $BS_{2n-1}$ to $BS_{2n+2}$, $\overline{CASE}$ 160 and $\overline{CASo}$ 161 are alternately active. Thus the periods when the respective banks are not being accessed can be used for securing the precharge time pt1 for $\overline{CASE}$ and $\overline{CASo}$. However, after the switch-over of the data addresses to $BS_{2n+2}$ and $BS_{2m}$, even addresses (2 n+2 and 2 m ) occur in succession. Thus since the same bank (bank E300) is accessed consecutively, it is liable to be impossible to secure the required precharge time. This problem is coped with by the bank selection means 13b, which discriminates when consecutive accessing of the same bank occurs and then generates and sends to the RAS/CAS generator 13 a $\overline{WAIT}$ signal 7C. Based on the $\overline{WAIT}$ signal 7C and the $\overline{CAS}$ generation signal 16, the RAS/CAS generator 13 informs the processor (the READY signal generator 22 in the case of the example of FIG. 1) over a signal line 24a so as to have a WAIT state inserted in the bus cycle concerned. As a result, a WAIT state $BSW_{2m}$ is introduced. Then after the $\overline{CASE}$ 160 precharge time has been secured by $BSW_{2m}$, $\overline{CASE}$ 160 is made active by $BSW_{2m}$, with the result that successive accessing of bank E300 can be carried out with no inconsistency. In this connection, even where consecutive access of the same bank occurs, it is more effective to arrange for the $\overline{WAIT}$ signal 7C not to be generated in a case where one or more idle states (meaning a cycle in which the processor does not request access to the dynamic memory system 3 concerned) have been introduced between the two bus cycles. In the case where the bank $\overline{CAS}$ generating means 13a receives CAS switch information 7b and the $\overline{CAS}$ generation signal from the RAS/CAS generator 13 is active, if signal 7b instructs access of the bank E300, $\overline{CASE}$ 160 is made active LO and applied to the bank E300, and if the signal 7b instructs access of the bank o301, $\overline{CASo}$ 160 is made active LO and applied to the bank o301.

In the present embodiment, separate banks are provided for even and odd data addresses. If desired, however, it is possible to provide an arbitrary number n ($n \geq 2$) of banks. In this case, let m be the data address and l be the bank number ($0 \leq l \leq n-1$). It then suffices to generate $\overline{CAS}$ signals for the respective banks by having a bank switching means judge when the remainder obtained by dividing m by n (m÷n) is equal to the bank number l, i.e. to judge when m=n·k+l (where l, m, n and k are all integers), and then to send a CAS switch signal 7b to the $\overline{CAS}$ generating means 13a. The problem regarding consecutive accessing of the same bank is the same as that in the case of a 2-bank system.

The aforesaid system can be used with a processor having a faster machine cycle time since it enables the $\overline{CAS}$ access time at1 to be reduced.

Referring to FIG. 12, there will now be explained an embodiment of the invention in which the function for generating the refresh cycle is incorporated in the memory access device 2. A refresh request generating means 12a periodically (once per refresh cycle) generates and applies to the RAS/CAS generator 13 a refresh request 12C: When the current memory access cycle with respect to the dynamic memory system 3 ends or if it has already ended, the RAS/CAS generator 13 immediately causes the $\overline{RAS}$ signal 15 to rise and make the bus cycle inactive and at the same time sends to the request generation means 12a a signal indicating that the refresh cycle has begun. Upon receiving this signal, the request generation means 12a sends the multiplexer 12 a signal 12d requesting generation of a refresh address. The multiplexer 12 is provided with a counter for generating refresh addresses, which produces a refresh address signal in accordance with the signal 12d. After securing a sufficient $\overline{RAS}$ precharge time, the RAS/CAS generator means causes the $\overline{RAS}$ signal to fall, whereby the refresh address is latched by the dynamic memory system 3. It is also effective to use an arrangement wherein, after the refresh has been completed, the $\overline{RAS}$ signal is once more caused to rise and then after securing a sufficient $\overline{RAS}$ precharge time, the $\overline{RAS}$ signal is caused to fall for having the most recently selected page address latched by the dynamic memory system 3. This is advantageous because the probability becomes high that the access of the next page will begin immediately.

As has been explained in the foregoing, the present invention provides page-organized DRAM whose pages are divided into a plurality of groups each storing data which are not likely to give rise to inter-page interference among themselves and the DRAM of each group is constituted as a memory which responds to page accessing. Thus a plurality of independently accessible memory systems which can be page accessed are made available. This makes it possible to carry out memory access at a high speed comparable to that possible with static memory and also reduces the overhead caused by page non-coincidence (page fault). As a result, random access can be conducted at a high speed on a par with that possible using a cache memory under circumstances most favorable to a cache memory. Moreover, this high-speed random accessing can be sustained even in a system which has many dynamic implementations that would greatly impair the speed of a cache memory.

What is claimed is:

1. A memory device comprising:
   a plurality of memory groups, each memory group including a plurality of memory subgroups wherein each memory subgroup is associated with a specific page and the pages associated with the respective memory subgroups in each memory group have minimum interference with each other, the memories of each memory group constituting a memory system responsive to a page access, said memory system comprising:
   memory means, responsive to a current access designating a new page address of the memory system, for storing an old page address designated at least one access earlier than said current access;
   judging means responsive to the access of said new page address for judging whether the new page address designated by said current access coincides with the old page address stored in said memory means;
   means for executing a page access according to the old page address when the result of the judging indicates a coincidence between them, and executing a page access according to the new page address when the result of the judging indicates a non-coincidence between them; and
   refresh control means provided for said memory system of each group and for selectively operating a refresh cycle by providing a refresh address instead of the new page address to the memory system of a group and including means for making a RAS signal non-active for a time interval sufficient for RAS precharge after completion of the refresh cycle and again active after a lapse of the time interval and at the same time providing the old page address to the memory system of the group thereby providing a return of the operation to the page access mode.

2. A memory device according to claim 1, wherein said refresh control means further includes means for executing the RAS precharge, which limits activation of the page access mode, until after completion of the refresh cycle of the DRAMs of the group and for returning the operation to the page access mode after completion of the refresh cycle.

3. A memory device according to claim 1, wherein said old page address corresponds to the current page address.

4. A memory device comprising:
   dynamic random access memories (DRAMs) organized by page, said DRAMs being divided into a plurality of groups each constituted of pages for storing data which are unlikely to give rise to interference between pages, the DRAMs of each group being constituted as a memory system which responds to a page access;
   page address memory means provided separately for said memory system of each group, which, in response to an access designating a new page address of the memory system associated therewith, stores an old page address designated at least one access earlier;
   judging means which, in response to a page address access, judges whether or not a new page address designated by an access coincides with an old page address stored in said page address memory means;
   means for conducting a page access in accordance with said old page address if said judging means judges that said old and new page addresses coincide and for conducting page access in accordance with said new page address after changing the page to be accessed to said new page if said old and new page addresses do not coincide; and
   refresh control means provided for said memory system of each group and for selectively operating a refresh cycle by providing a refresh address instead of the new page address to the memory system of a group and including means for making a RAS signal non-active for a time interval sufficient for RAS precharge after completion of the refresh cycle and again active after a lapse of the time interval and at the same time providing the old page address to the memory system of the group thereby providing a return of the operation to the page access mode.

5. A memory device according to claim 4, wherein said refresh control means further includes means for executing the RAS precharge, which limits activation of the page access mode, until after completion of the refresh cycle of the DRAMs of the group and for returning the operation to the page access mode after completion of the refresh cycle.

6. A memory device according to claim 4, wherein said old page address corresponds to the current page address.

7. A memory device comprising:
a plurality of memory groups, each memory group including a plurality of memory subgroups wherein each memory subgroup is associated with a specific page and the pages associated with the respective memory subgroups in each memory group have minimum interference with each other, the memories of each memory group constituting a memory system responsive to a page access, said memory system comprising:
memory means, responsive to a current access designating a new page address of the memory system, for storing an old page address designated at least one access earlier than said current access;
judging means, responsive to the current access of said new page address, for judging whether the new page address designated by said current access coincides with the old page address stored in said memory means;
means for executing a page access according to the old page address and storing said new page address in place of said old page address in said memory means when the result of the judging indicates a coincidence between them, and executing a page access according to the new page address when the result of the judging indicates a non-coincidence between them; and
refresh control means provided for said memory system of each group and for selectively operating a refresh cycle by providing a refresh address instead of the new page address to the memory system of a group and including means for making a RAS signal non-active for a time interval sufficient for RAS precharge after completion of the refresh cycle and again active after a lapse of the time interval and at the same time providing the old page address to the memory system of the group thereby providing a return of the operation to the page access mode.

8. A memory device according to claim 7, wherein said refresh control means further includes means for executing the RAS precharge which limits activation of the page access mode, until after completion of the refresh cycle of the DRAMs of the group and for returning the operation to the page access mode after completion of the refresh cycle.

9. A memory device according to claim 7, wherein said old page address corresponds to the current page address.

10. A memory device comprising:
a plurality of DRAMs, each DRAM including memory cells arranged in a matrix array, said DRAMs being divided into a plurality of DRAM groups, each DRAM group including a plurality of DRAM subgroups associated with specific pages, respectively, said specific pages storing respective data which have minimum interference with each other, the DRAMs of each DRAM group constituting a memory system responsive to a page mode access in a high-speed page mode, a static column mode or a nibble mode, said memory system comprising:
memory means, responsive to a current access designating a new page address of the memory system, for storing an old page address designated at least one access earlier than said current access;
judging means, responsive to the current access of said new page address, for judging whether the new page address designated by said current access coincides with the old page address stored in said memory means;
memory access means, including paging access means for instructing said memory system of a group for a page mode access according to the old page address and storing said new page address in place of said old page address in said memory means when the result of the judging indicates a coincidence between them, and a page mode access according to the new page address when the result of the judging indicates a non-coincidence between them; and
refresh control means provided for said memory system of each group and for selectively operating a refresh cycle by providing a refresh address instead of the new address to the memory system of a group and including means for making a RAS signal non-active for a time interval sufficient for RAS precharge after completion of the refresh cycle and again active after a lapse of the time interval and at the same time providing the old page address to the memory system of the group thereby providing a return of the operation to the page access mode.

11. A memory device according to claim 10, wherein said refresh control means further includes means for executing the RAS precharge which limits activation of the page access mode, until after completion of the refresh cycle of the DRAMs of the group and for returning the operation to the page access mode after completion of the refresh cycle.

12. A memory device according to claim 11, wherein said old page address corresponds to the current page address.

13. A memory device comprising:
a plurality of DRAMs, each DRAM including memory cells arranged in a matrix array, said DRAMs being divided into a plurality of DRAM groups, each DRAM group including a plurality of DRAM subgroups associated with specific pages, respectively, said specific pages storing respective data which have minimum interference with each other, the DRAMs of each DRAM group constituting a memory system responsive to a page mode access in a high-speed page mode, a static column mode or a nibble mode, said memory system comprising:
memory means, responsive to a current access designating a new page address of the memory system, for storing an old page address designated at least one access earlier than said current access;
judging means responsive to the current access using said new page address for judging whether the new page address designated by said current access coincides with the old page address stored in said memory means;
memory access means, including paging access means for instructing said memory system of a group for a page mode access according to the old page address when the result of the judging indicates a coincidence between them, and a page mode access according to the new page address when the result of the judging indicates a non-coincidence between them; and refresh control means provided for said memory system of each group and for selectively operating a refresh cycle by providing a refresh address instead of the new page address to the memory system of a group and including means for making a RAS signal non-active for a time interval sufficient for RAS precharge after completion of the refresh cycle and again active after a lapse of the time interval and at the same time providing the old page address to the memory system of the group thereby providing a return of the operation to the page access mode.

14. A memory device according to claim 13, further comprising communication means for connecting said memory device to a processor, said communication means including a first communication means for transmitting instruction data including instruction codes defining processing operations of said processor from said memory device to said processor and second communication means for transmitting operand data to be processed according to said instruction codes between said memory device and said processor and wherein said DRAM groups includes at least a first group constituting a first memory system for storing said instruction data and a second group constituting a second memory system for storing said operand data.

15. A memory device according to claim 14, wherein said first and second communication means are operable independently of each other and assigned to said first and second memory systems, respectively.

16. A memory device according to claim 13, wherein the memory system constituting at least one of said DRAM groups is divided into n sets of banks (bank numbers $m=0$ to $n-1$) and said memory access means includes bank access judging means for allowing a m-th bank having a bank number m ($0 \leq m \leq n-1$) to respond to an access to a data address A when a remainder in computation of $A \div n$ coincides with the bank number m, that is when an equation $A = a \times n + m$ is satisfied, where A, n and m are integers and where a is an integer corresponding to that which allows access of the bank number m by address A.

17. A memory device according to claim 16, wherein n is two so that the memory system is divided into first and second banks and an odd-numbered data address is assigned to the first bank and an even-numbered data address is assigned to the second bank.

18. A memory device according to claim 16, wherein said memory access means further includes switching means for switching a CAS signal, supplied to a selected one of the banks, for setting an address of one of the memory cells belonging to the subgroup associated with a specific page and activating an access to the one memory cell, and said bank access judging means includes means for applying to said switching means switching information for allowing said CAS signal to be supplied to the bank which is allowed to access to the data address.

19. A memory device according to claim 18, wherein a precharge time for said CAS signal supplied to one of the banks is allocated during a period of time when said one bank is not being accessed.

20. A memory device according to claim 18, further comprising means for allowing random access to the memory cells belonging to the specific page based on said CAS signal, when said specific page is selected and unchanged.

21. A memory device according to claim 13, wherein said refresh control means further includes means for executing the RAS precharge which limits activation of the page access mode, until after completion of the refresh cycle of the DRAMs of the group and for returning the operation to the page access mode after completion of the refresh cycle.

22. A memory device according to claim 13, wherein said old page address corresponds to the current page address.

* * * * *